: US 7,858,418 B2
(45) Date of Patent: Dec. 28, 2010

(12) United States Patent
Watanabe et al.

(54) LIGHT EMITTING DEVICE AND METHOD OF MANUFACTURING THE SAME

(75) Inventors: Yoshiaki Watanabe, Kanagawa (JP);
Tomonori Hino, Kanagawa (JP);
Nobukata Okano, Kanagawa (JP);
Hisayoshi Kuramochi, Kanagawa (JP);
Yuichiro Kikuchi, Kanagawa (JP);
Tatsuo Ohashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 517 days.

(21) Appl. No.: 11/873,763

(22) Filed: Oct. 17, 2007

(65) Prior Publication Data
US 2008/0128721 A1    Jun. 5, 2008

(30) Foreign Application Priority Data
Oct. 18, 2006   (JP)   ............... 2006-284051

(51) Int. Cl.
*H01L 21/00* (2006.01)
(52) U.S. Cl. .............. 438/46; 438/29; 438/39; 257/631
(58) Field of Classification Search .......... 438/29, 438/39, 46
See application file for complete search history.

(56) References Cited

U.S. PATENT DOCUMENTS

| 5,366,910 | A * | 11/1994 | Ha et al. ............ 438/158 |
| 5,866,476 | A * | 2/1999 | Choi et al. ............ 438/624 |
| 6,097,040 | A * | 8/2000 | Morimoto et al. ........ 257/91 |
| 6,320,206 | B1 * | 11/2001 | Coman et al. ........... 257/94 |
| 6,982,443 | B2 * | 1/2006 | Hsu et al. ............. 257/226 |
| 7,045,375 | B1 * | 5/2006 | Wu et al. .............. 438/35 |
| 7,061,065 | B2 * | 6/2006 | Horng et al. ........... 257/434 |
| 7,118,930 | B1 * | 10/2006 | Wuu et al. ............. 438/22 |
| 7,166,483 | B2 * | 1/2007 | Liu et al. .............. 438/29 |
| 7,291,865 | B2 * | 11/2007 | Kojima et al. .......... 257/98 |

(Continued)

FOREIGN PATENT DOCUMENTS

EP       1450417       8/2004

(Continued)

OTHER PUBLICATIONS

Japanese Office Action dated May 9, 2008 for U.S. Appl. No. 2006-284051.

(Continued)

*Primary Examiner*—Jarrett J Stark
*Assistant Examiner*—Nicholas Tobergte
(74) *Attorney, Agent, or Firm*—SNR Denton US LLP

(57) ABSTRACT

Herein disclosed a method of manufacturing a light emitting device, including the steps of: (A) sequentially forming a first compound semiconductor layer of a first conduction type, an active layer, and a second compound semiconductor layer of a second conduction type different from said first conduction type, over a substrate; and (B) exposing a part of said first compound semiconductor layer, forming a first electrode over said exposed part of said first compound semiconductor layer and forming a second electrode over said second compound semiconductor layer, wherein said method further includes, subsequent to said step (B), the step of: (C) covering at least said exposed part of said first compound semiconductor layer, an exposed part of said active layer, an exposed part of said second compound semiconductor layer, and a part of said second electrode with an SOG layer.

14 Claims, 8 Drawing Sheets

U.S. PATENT DOCUMENTS

| | | | |
|---|---|---|---|
| 7,476,903 B2 * | 1/2009 | Murayama | 257/79 |
| 2005/0224812 A1 | 10/2005 | Liu et al. | |
| 2005/0279990 A1 | 12/2005 | Liu et al. | |
| 2009/0090923 A1 * | 4/2009 | Murayama | 257/97 |

FOREIGN PATENT DOCUMENTS

| | | |
|---|---|---|
| EP | 1705702 | 9/2006 |
| JP | 04-343431 | 11/1992 |
| JP | 06-310505 | 11/1994 |
| JP | 06310505 | 11/1994 |
| JP | 07-066179 | 3/1995 |
| JP | 09-199495 | 7/1997 |
| JP | 10-107030 | 4/1998 |
| JP | 3068914 | 3/2000 |
| JP | 2005-019945 | 1/2005 |
| JP | 2005-294284 | 10/2005 |
| JP | 2005-310937 | 11/2005 |
| JP | 2005310937 | 11/2005 |
| JP | 2006-253370 | 9/2006 |
| JP | 2006-351777 | 12/2006 |
| JP | 2007-096116 | 4/2007 |
| JP | 2007096116 | 4/2007 |

OTHER PUBLICATIONS

European Search Report corresponding to European Serial No. 07020315 dated Sep. 10, 2009.

* cited by examiner

LIGHT EMITTING DEVICE AND METHOD OF MANUFACTURING THE SAME

CROSS REFERENCES TO RELATED APPLICATIONS

The present invention contains subject matter related to Japanese Patent Application JP 2006-284051 filed in the Japan Patent Office on Oct. 18, 2006, the entire contents of which being incorporated herein by reference.

BACKGROUND OF THE INVENTION

1. Field of the Invention

The present invention relates to a light emitting device and a method of manufacturing the same.

2. Description of the Related Art

A light emitting diode (LED) according to the related art, for example, one disclosed in Japanese Utility Model No. 3068914 has a light emitting layer having a stack structure in which, for example, an under layer 10B formed based on an MOCVD method, a first compound semiconductor layer 11 of a first conduction type (e.g., n-type), an active layer 12, and a second compound semiconductor layer 13 of a second conduction type (e.g., p-type) are stacked over a substrate 10A including, for example, sapphire, as shown in a schematic sectional view in FIG. 8. A second electrode 14 is provided over the second compound semiconductor layer 13. In addition, a part of the first compound semiconductor layer 11 is exposed by removing a part of the second compound semiconductor layer 13 and a part of the active layer 12, and a first electrode 15 is provided over the exposed part of the first compound semiconductor layer 11. A current is passed from the second electrode 14 through the part of the active layer 12 beneath the second compound semiconductor layer 13 thus left to the first compound semiconductor layer 11 and the first electrode 15. As a result, in the active layer 12, a quantum well structure of the active layer 12 is excited by the injection of the current, and a light emitting state is obtained over the whole surface area.

In a light emitting diode of the substrate-side light pickup type, the light emitted from the active layer 12 is transmitted directly through the substrate 10A to go out to the exterior, or is reflected by the second electrode 14 to be transmitted through the substrate 10A and to go out to the exterior. On the other hand, in a light emitting diode of the electrode transmitted light pickup type, the light emitted from the active layer 12 is transmitted through the second electrode 14 to go out to the exterior. Therefore, not only the reliability of the compound semiconductor layer serving as the light emitting layer but also the reliability (e.g., environmental resistance and uniformity) of the electrodes are of extreme importance.

As a material constituting the second electrode 14, silver (Ag) having a high reflectance is used in the light emitting diode of the substrate-side light pickup type, whereas ITO for constituting a transparent electrode is used in the light emitting diode of the electrode transmitted light pickup type. In order to enhance the reliability of the second electrode 14, usually, the second electrode 14 is covered with an insulating film 116 formed by a CVD method such as plasma CVD, etc. or a PVD method such as vacuum evaporation, sputtering, etc. Openings 18A and 18B are provided in those parts of the insulating film 16 which are located on the upper side of the first electrode 15 and the second electrode 14, and a first contact part 19A and a second contact part 19B are provided respectively over the exposed parts of the first electrode 15 and the second electrode 14.

SUMMARY OF THE INVENTION

Meanwhile, pinholes and cracks are liable to be generated in the insulating film 116 formed based on a CVD method or a PVD method, and, in the case where a steep stepped part is present extending from the electrode structure or the device structure, it may be impossible to securely cover such a stepped part with the insulating film 116. In addition, pinholes and cracks may in some cases be generated in the insulating film 116 due to the presence of contamination, foreign matter or the like. When a few pinholes or cracks are generated in the insulating film 116 or when the coverage of the stepped part is poor, moisture (water) may penetrate into the device from the external atmosphere. When the moisture (water) reaches the second electrode 14 formed by use of silver (Ag) or ITO, ion migration may be generated or whiskers may be formed in the second electrode 14, possibly leading to deterioration of the second electrode 14 and, further, to deterioration of characteristics of the light emitting diode.

In order to restrain the generation of pinholes or cracks, there may be adopted a method of raising the substrate heating temperature during formation of the insulating film 116, or a method of improving the under layer (substrate layer) by, for example, cleaning the surface of the second electrode 14 by such a method as back sputtering. However, these methods are liable to produce other problems due to the influence of heat history, plasma damage or the like. In addition, it is difficult to securely cover a steep stepped part with the insulating film 116, and such a stepped part will in many cases serve as a discontinuity point in film growth of the insulating film 116.

Accordingly, there is a need for a light emitting device having a structure in which pinholes or cracks are not liable to be generated and in which an electrode is covered with a covering layer (insulating layer) excellent in step coverage, and for a method of manufacturing the same.

According to one embodiment of the present invention, there is provided a method of manufacturing a light emitting device, including the steps of:

(A) sequentially forming a first compound semiconductor layer of a first conduction type, an active layer, and a second compound semiconductor layer of a second conduction type different from the first conduction type, over a substrate; and (B) exposing a part of the first compound semiconductor layer, forming a first electrode over the exposed part of the first compound semiconductor layer and forming a second electrode over the second compound semiconductor layer, wherein the method further includes, subsequent to said step (B), the step of:

(C) covering at least the exposed part of the first compound semiconductor layer, an exposed part of the active layer, an exposed part of the second compound semiconductor layer, and a part of the second electrode with an SOG layer.

In the method of manufacturing a light emitting device according to the one embodiment of the present invention, preferably, in the step (C), the exposed part of the first compound semiconductor layer, the exposed part of the active layer, the exposed part of the second compound semiconductor layer, the second electrode, and the first electrode are covered with the SOG layer, and thereafter a first opening and a second opening are formed respectively in that part of the SOG layer which is located over the first electrode and in that part of the SOG layer which is located over the second electrode.

In this case, a configuration may be adopted wherein in the step (C), the exposed part of the first compound semiconductor layer, the exposed part of the active layer, the exposed part of the second compound semiconductor layer, the second electrode, and the first electrode are covered with a first insulating layer, thereafter the first insulating layer is covered with an SOG layer, and a first opening and a second opening are formed in the SOG layer and the first insulating layer.

Or, in this case, a configuration may be adopted wherein in the step (C), the exposed part of the first compound semiconductor layer, the exposed part of the active layer, the exposed part of the second compound semiconductor layer, the second electrode, and the first electrode are covered with an SOG layer, thereafter the SOG layer is covered with a second insulating layer, and a first opening and a second opening are formed in the second insulating layer and the SOG layer.

Or, in this case, a configuration may be adopted wherein in the step (C), the exposed part of the first compound semiconductor layer, the exposed part of the active layer, the exposed part of the second compound semiconductor layer, the second electrode, and the first electrode are covered with a first insulating layer, thereafter the first insulating layer is covered with an SOG layer, the SOG layer is further covered with a second insulating layer, and then a first opening and a second opening are formed in the second insulating layer, the SOG layer and the first insulating layer.

In the method of manufacturing a light emitting device according to the one embodiment of the present invention, further, a step of forming a first contact part extending to the upper side of the SOG layer from the first electrode through the first opening and forming a second contact layer extending to the upper side of the SOG layer from the second electrode through the second opening may be provided.

In the method of manufacturing a light emitting diode according to the embodiment of the present invention, from the viewpoint of simplification of steps, the first opening and the second opening are preferably formed in the same step. In addition, from the viewpoint of simplification of steps, the first contact part and the second contact part are preferably formed in the same step. It is to be noted here, however, that in the case where it is necessary to match the level of the top surface of the first contact part to the level of the top surface of the second contact part, the first contact part and the second contact part are preferably formed in different steps.

According to another embodiment of the present invention, there is provided a method of manufacturing a light emitting device, including the steps of:

(A) sequentially forming a first compound semiconductor layer of a first conduction type, an active layer, and a second compound semiconductor layer of a second conduction type different from the first conduction type, over a substrate; and (B) exposing a part of the first compound semiconductor layer and forming a second electrode over the second compound semiconductor layer, wherein the method further includes, subsequent to said step (B), the steps of:

(C) covering the exposed part of the first compound semiconductor layer exclusive of a part at which to form a first electrode, an exposed part of the active layer, an exposed part of the second compound semiconductor layer, and a part of the second electrode with an SOG layer; and (D) forming the first electrode over the part, at which to form the first electrode, of the exposed part of the first compound semiconductor layer.

In the method of manufacturing a light emitting device according to the another embodiment of the present invention, preferably, the exposed part of the first compound semiconductor layer, the exposed part of the active layer, the exposed part of the second compound semiconductor layer, and the second electrode are covered with the SOG layer, then a first opening is formed in a part of the SOG layer covering the part, at which to form the first electrode, of the exposed part of the first compound semiconductor layer, and a second opening is formed in that part of the SOG layer which covers the second electrode, in the step (C); and the first electrode is formed on that part of the first compound semiconductor layer which is exposed at a bottom part of the first opening, in the step (D).

In this case, a configuration may be adopted wherein in the step (C), the exposed part of the first compound semiconductor layer, the exposed part of the active layer, the exposed part of the second compound semiconductor layer, and the second electrode are covered with a first insulating layer, thereafter the first insulating layer is covered with the SOG layer, then the first opening is formed in those parts of the SOG layer and the first insulating layer which cover the part, at which to form the first electrode, of the exposed part of the first compound semiconductor layer, and the second opening is formed in those parts of the SOG layer and the first insulating layer which cover the second electrode.

Or, in this case, a configuration may be adopted wherein in the step (C), the exposed part of the first compound semiconductor layer, the exposed part of the active layer, the exposed part of the second compound semiconductor layer, and the second electrode are covered with the SOG layer, thereafter the SOG layer is covered with a second insulating layer, then the first opening is formed in those parts of the second insulating layer and the SOG layer which cover the part, at which to form the first electrode, of the exposed part of the first compound semiconductor layer, and the second opening is formed in those parts of the second insulating layer and the SOG layer which cover the second electrode.

Or, in this case, a configuration may be adopted wherein in the step (C), the exposed part of the first compound semiconductor layer, the exposed part of the active layer, the exposed part of the second compound semiconductor layer, and the second electrode are covered with a first insulating layer, thereafter the first insulating layer is covered with the SOG layer, the SOG layer is further covered with a second insulating layer, then the first opening is formed in those parts of the second insulating layer, the SOG layer and the first insulating layer which cover the part, at which to form the first electrode, of the exposed part of the first compound semiconductor layer, and the second opening is formed in those parts of the second insulating layer, the SOG layer and the first insulating layer which cover the second electrode.

In the method of manufacturing a light emitting device according to the another embodiment of the present invention, further, a step of forming a first contact part extending to the upper side of the SOG layer from the first electrode through the first opening and forming a second contact part extending to the upper side of the SOG layer from the second electrode through the second opening may be provided.

Incidentally, in the method of manufacturing a light emitting diode according to the another embodiment of the present invention, from the viewpoint of simplification of steps, the first opening and the second opening are preferably formed in the same step. In addition, from the viewpoint of simplification of steps, the first contact part and the second contact part are preferably formed in the same step. It is to be noted here, however, that in the case where it is necessary to match the level of the top surface of the first contact part to the level of the top surface of the second contact part, the first contact part and the second contact part are preferably formed in different steps. Furthermore, in order to prevent contact or shortcircuit between a wiring connected to the first contact part and the second contact part from occurring due to solder at the time of mounting, an insulating film covering such a wiring may be formed.

In the method of manufacturing a light emitting device according to the one embodiment or the another embodiment of the present invention inclusive of the preferred configurations described above (hereinafter these may be referred generically to simply as the method of manufacturing a light emitting device in the present invention), the second electrode may include ITO (indium oxide doped with tin oxide), and, in the step (C), an SOG material layer as an SOG layer precursor may be formed (over the whole surface area) and then the SOG material layer may be baked to obtain the SOG layer and, simultaneously, to anneal the ITO constituting the second electrode, whereby simplification of manufacturing steps of the light emitting device can be contrived. Incidentally, in such a configuration, in the case where the light emitting device is a light emitting diode, the light emitting diode is of the electrode transmitted light pickup type, in which the light emitted from the active layer is transmitted through the second compound semiconductor layer, the second electrode, and the SOG layer, to go out to the exterior.

In this case, examples of the baking conditions for the SOG material layer in the step (C) include the following conditions.

Baking atmosphere: inert gas atmosphere, or inactive gas atmosphere containing 0.1 to 20 vol %, preferably 2 to 5 vol %, of oxygen gas Baking temperature: 250 to 700° C., preferably 400 to 600° C.

Baking time: 5 to 60 min, preferably 20 to 40 min

Or, in the method of manufacturing a light emitting device in the present invention, the second electrode may include silver (inclusive of silver alloys containing In, Cu, Pd, Ni, Co, Rh, or Pt). Incidentally, in such a configuration, in the case where the light emitting device is a light emitting diode, the light emitting diode is of the substrate-side light pickup type, in which the light emitted from the active layer is transmitted directly through the substrate to go out to the exterior, or is reflected by the second electrode to be transmitted through the substrate and to go out to the exterior. With the second electrode including silver (Ag), it is possible to attain a reflectance of not less than 96%, for example.

In the method of manufacturing a light emitting device in the present invention inclusive of the preferred configurations described above, preferably, there is further provided a step of exposing the surface of the SOG layer to a plasma atmosphere after the SOG layer is formed (over the whole surface area) in the step (C). With the surface of the SOG layer thus exposed to a plasma atmosphere, organic matters (e.g., hydrocarbons) contained in the surface portion of the SOG layer are removed, whereby an SOG layer with high quality can be obtained. The conditions of the plasma atmosphere include a plasma atmosphere composed by using $O_2$ gas, Ar gas, $N_2$ gas or the like either singly or in mixture, and a pressure of 0.1 to 100 Pa. The applied power and the treating time may be determined taking into account the plasma apparatus, plasma damage and effects; for example, an applied power of about 350 W and a treating time of about 10 min may be adopted.

According to a further embodiment of the present invention, there is provided a light emitting device including:

(a) a first compound semiconductor layer of a first conduction type, an active layer, and a second compound semiconductor layer of a second conduction type different from the first conduction type which are sequentially formed over a substrate;

(b) a first electrode formed over an exposed part of the first compound semiconductor layer; and (c) a second electrode formed over the second compound semiconductor layer, wherein at least the exposed part of the first compound semiconductor layer, an exposed part of the active layer, an exposed part of the second compound semiconductor layer, and a part of the second electrode are covered with an SOG layer.

While at least the exposed part of the first compound semiconductor layer (that part of the first compound semiconductor layer which is not covered with the first electrode), an exposed part of the active layer, an exposed part of the second compound semiconductor layer, and a part of the second electrode are covered with an SOG layer, the SOG layer may, depending on the structure of the light emitting device, have:

(1) a configuration in which it covers the exposed part of the first compound semiconductor layer (that part of the first compound semiconductor layer which is not covered with the first electrode), the exposed part of the active layer, the exposed part of the second compound semiconductor layer (that part of the second compound semiconductor layer which is not covered with the second electrode), and a part of the second electrode; or (2) a configuration in which it covers the exposed part of the first compound semiconductor layer (that part of the first compound semiconductor layer which is not covered with the first electrode), the exposed part of the active layer, the exposed part of the second compound semiconductor layer (that part of the second compound semiconductor layer which is not covered with the second electrode), a part of the second electrode, and a part of the first electrode.

In the light emitting device in the present invention, there may be adopted a configuration wherein a first insulating layer is formed under the SOG layer (specifically, at least between the exposed part of the first compound semiconductor layer and the SOG layer, between the exposed part of the active layer and the SOG layer, between the exposed part of the second compound semiconductor layer and the SOG layer, and between the second electrode and the SOG layer), a configuration wherein a second insulating layer is formed over the SOG layer, or a configuration wherein a first insulating layer is formed under the SOG layer (specifically, at least between the exposed part of the first compound semiconductor layer and the SOG layer, between the exposed part of the active layer and the SOG layer, between the exposed part of the second compound semiconductor layer and the SOG layer, and between the second electrode and the SOG layer) and wherein a second insulating layer is formed over the SOG layer.

In the light emitting device in the present invention inclusive of the preferred configurations described above, a configuration may be adopted wherein a first contact part is formed over the first electrode, and a second contact part is formed over the second electrode.

In the method of manufacturing a light emitting device in the present invention or the light emitting device in the present invention inclusive of the preferred embodiments described above (hereinafter these may be referred generically to simply as the present invention), the SOG material layer refers to a layer formed by applying a solution obtained by dissolving a silicic acid compound (a compound composed mainly of silanol, olysilazane (Si, O, (N, H)), alkyl group, alkoxyl group or the like) in an organic solvent (e.g., an alcohol or butyl acetate) by one of various coating methods. When the organic solvent is removed from the SOG material layer and then the SOG material layer is baked, an SOG (Spin On Glass) layer containing silicate glass ($SiO_2$) as a main ingredient can be obtained. Incidentally, depending on the material for constituting the SOG material layer, the SOG layer containing silicate glass ($SiO_2$) as a main constituent can be obtained also by irradiating the SOG material layer with electron beams or UV rays. Though SOG layers generally have a high internal stress, no problem will arise from the internal stress if an SOG layer as thin as $1 \times 10^{-8}$ m (10 nm) to $3 \times 10^{-7}$ m (300 nm), for example, is formed. Examples of the coating method include spin coating method; various printing methods such as screen printing method, ink jet printing method, offset printing method, gravure printing method, etc.; various coating methods such as air doctor coater method, blade coater method, rod coater method, knife coater method, squeeze coater method, reverse roll coater method, transfer roll coater method, gravure coater method, kiss-roll coater method, cast coater method, spray coater method, slit orifice coater method, calendar coater method, dipping method, etc.; stamping method; spraying method, etc.

In the present invention, examples of the substrate include sapphire substrate, GaAs substrate, GaN substrate, SiC substrate, alumina substrate, ZnS substrate, ZnO substrate, AlN substrate, LiMgO substrate, $LiGaO_2$ substrate, $MgAl_2O_4$ substrate, InP substrate, Si substrate, and these substrates with an under layer or a buffer layer formed on the surface (major surface) thereof.

Examples of the materials constituting the first compound semiconductor layer, the active layer, and the second compound semiconductor layer include GaN based compound semiconductors (inclusive of AlGaN mixed crystal, AlInGaN mixed crystal, and InGaN mixed crystal), InN based compound semiconductors, AlN based compound semiconductors, AlGaInP based compound semiconductors, AlGaInAs based compound semiconductors, GaInAs based compound semiconductors, GaInAsP based compound semiconductors, GaP based compound semiconductors, and InP based compound semiconductors. Examples of the methods for forming the first compound semiconductor layer, the active layer, and the second compound semiconductor layer (film forming methods) include metal organic chemical vapor deposition method (MOCVD method), electron beam epitaxy method (MBE method), and hydride vapor deposition method in which a halogen contributes to transportation or reaction.

Where the first conduction type is n-type, the second conduction type is p-type, and where the first conduction type is p-type, the second conduction type is n-type.

Examples of the method for exposing a part of the first compound semiconductor layer include a combination of a lithography technique with a wet etching method or a dry etching method.

The second electrode is configured by use of ITO or by use of Ag (inclusive of Ag alloys). Examples of the method for forming the second electrode include PVD methods such as vacuum evaporation method, sputtering method, etc., and various CVD methods.

Examples of the first electrodes include electrodes including titanium (Ti) or a titanium alloy such as TiW and TiMo (for example, a TiW layer, a Ti layer/Ni layer/Au layer, or the like), and electrodes including aluminum (Al) or an aluminum alloy. Incidentally, the layer described before "/" is located nearer to the substrate (i.e., located on the more lower side), here and hereinafter. In addition, examples of the first contact part (first pad part) and the second contact part (second pad part) include multi-layer metallic layers having a stack (laminate) structure of [adhesion layer (Ti layer, Cr layer or the like)]/[barrier metal layer (Pt layer, Ni layer, TiW layer, Mo layer or the like)]/[metallic layer with good compatibility to mounting (for example, Au layer)] such as Ti layer/Pt layer/Au layer. Examples of the method for forming the first electrode and the methods for forming the first contact part (first pad part) and the second contact part (second pad part) include PVD methods such as vacuum evaporation method, sputtering method, etc., various CVD methods, and plating methods.

Examples of the materials constituting the first insulating layer and the second insulating layer include $SiO_X$ based materials, $SiN_Y$ based materials, $SiO_XN_Y$ material, $Ta_2O_5$, $ZrO_2$, AlN, and $Al_2O_3$. Examples of the methods for forming the first insulating layer and the second insulating layer include PVD methods such as vacuum evaporation method, sputtering method, etc. and CVD methods.

Examples of the method(s) for forming the first opening and the second opening include a combination of a lithography technique with a wet etching method or a dry etching method. Incidentally, where the SOG layer is obtained by irradiating an SOG material layer with electron beams or UV rays, the first opening and the second opening can simultaneously be formed directly, without using an exposure mask or the like.

Examples of the light emitting device include light emitting diodes (LEDs) and semiconductor lasers.

For example, in formation of insulating films by PVD methods such as vacuum evaporation method, sputtering method, etc. or CVD methods, it is very difficult to perfectly obviating the generation of such defects or faults as grain boundaries, cracks, pinholes, etc., and this problem cannot be solved simply by increasing the thickness of the insulating film. Even if the film forming conditions are satisfactory for preventing the generation of defects or faults in the flat portion of the insulating film, generation of cracks or pinholes in the insulating film is liable to occur, in relation to electrodes or device structures with a thickness of, for example, at most several hundreds of micrometers, unavoidably formed steps, etc. Then, moisture (water) would penetrate into the device from the external atmosphere through such cranks or pinholes so as to easily ionize the metallic atoms constituting the electrode and to cause ion migration or the like, resulting in that breakage or deterioration which may lead to device failure proceeds.

In the present invention, the second electrode is covered with an SOG layer. The SOG material layer serving as a kind of precursor (SOG layer precursor) for forming the SOG layer is liquid, and the second electrode can be covered with the SOG material layer by a coating method. Therefore, the second electrode can be assuredly covered with a continuous film free of grain boundaries, and generation of pinholes or cracks can be obviated. As a result, moisture (water) from the external atmosphere can be securely prevented from reaching the second electrode including silver (Ag) or ITO, whereby it is possible to securely obviate the problem that ion migration is generated or whiskers are formed in the second electrode, leading to deterioration of the second electrode and, hence, to deterioration of characteristics of the light emitting diode. Therefore, it is possible to contrive enhanced reliability of the light emitting device, to maintain stable characteristics even under severe environmental conditions, and to achieve an increase in the yield of the light emitting device.

Incidentally, when the first insulating layer is formed under the SOG layer and/or the second insulating layer is formed over the SOG layer, the reliability of the light emitting device can be enhanced more. In addition, since the under layer (substrate layer) inclusive of the second electrode can be covered by a coating method, the discontinuity of stepped parts can be compensated for by a smoothing effect produced by surface tension, while "filling" or "burying" various defects or faults present in the so-called under layer (substrate layer) such as cracks, pinholes, etc. generated in the second electrode, for example. Accordingly, it is possible to cover the under layer (substrate layer) with a smoother SOG layer, and to form the second insulating layer on the smoother SOG layer.

DETAILED DESCRIPTION OF THE PREFERRED EMBODIMENTS

Figure 1A:
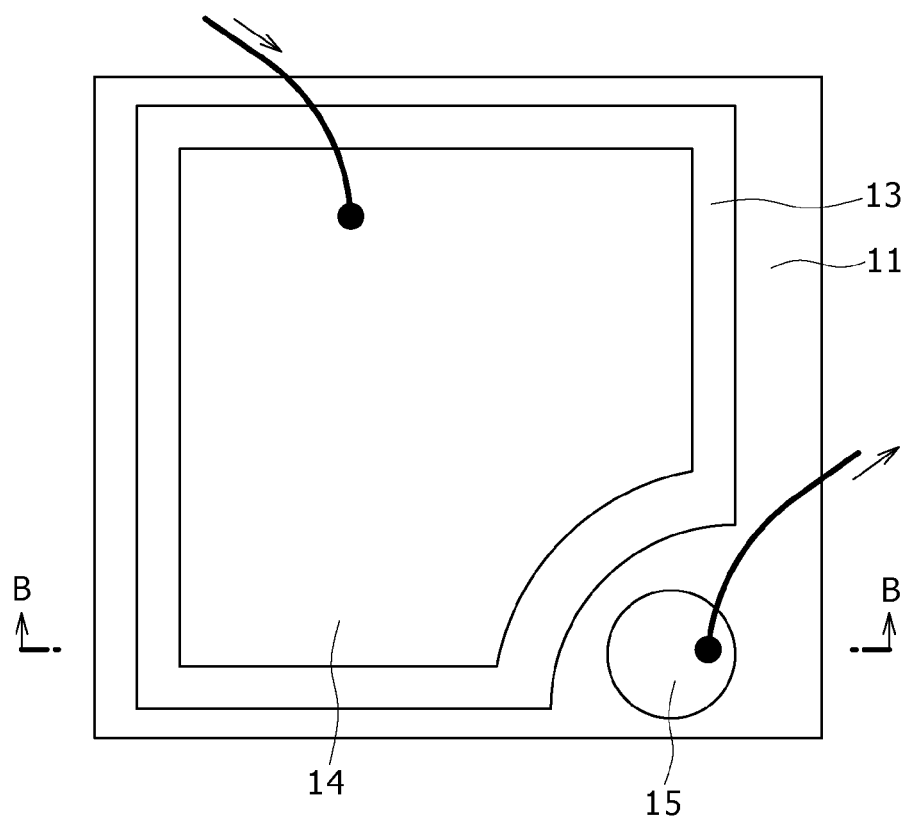
FIGS. 1A and 1B are respectively a schematic layout view of components of a light emitting device according to a first embodiment of the present invention, and a schematic sectional view of the light emitting device according to Example 1, taken along line B-B of FIG. 1A.

Now, the present invention will be described based on embodiments thereof, referring to the drawings.

EXAMPLE 1

Example 1 relates to a method of manufacturing a light emitting device according to a first embodiment of the present invention, and the light emitting device based on the present invention.

Figure 1B:
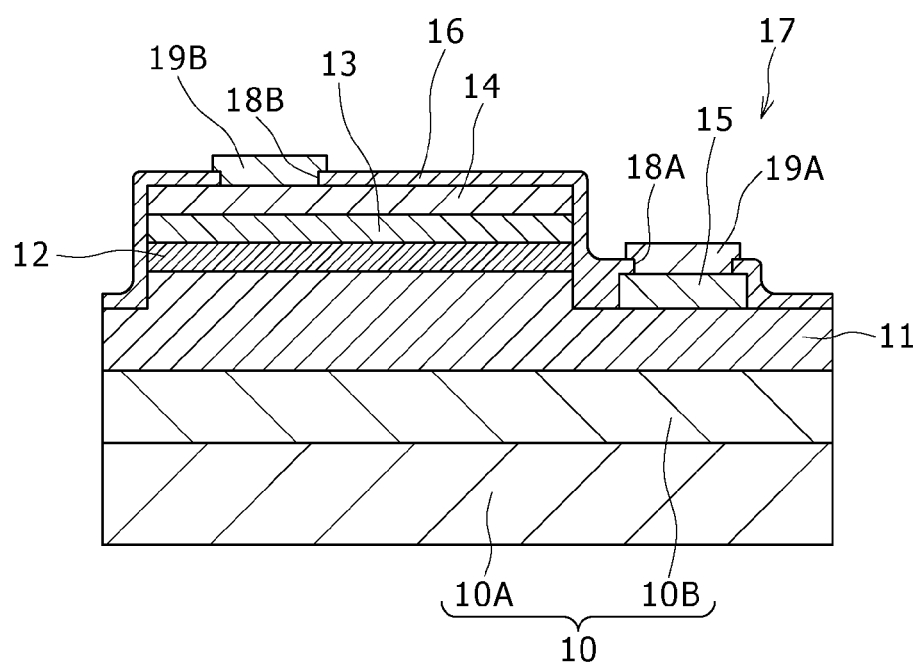

The light emitting device according to Example 1 includes a light emitting diode including GaN based compound semiconductor layers, and, as a schematic layout view of components is shown in FIG. 1A and a schematic sectional view is shown in FIG. 1B taken along line B-B of FIG. 1A, the light emitting device includes:

(a) a first compound semiconductor layer 11 of a first conduction type (n type, in Example 1), an active layer 12, and a second compound semiconductor layer 13 of a second conduction type (p type, in Example 1) different from the first conduction type, which are sequentially formed over a substrate 10;

(b) a first electrode 15 formed over an exposed part 17 of the first compound semiconductor layer 11; and (c) a second electrode 14 formed over the second compound semiconductor layer 13.

Here, the substrate 10 includes a substrate 10A including, for example, sapphire, and an under layer 10B including GaN formed over the substrate 10A. In addition, a light emitting layer structure includes a stack structure in which the first compound semiconductor layer 11 including Si-doped GaN (GaN:Si), the active layer 12 including an InGaN layer (well layer) and a GaN layer (barrier layer) and having a multiple quantum well structure, and the second compound semiconductor layer 13 including Mg-doped GaN (GaN:Mg) are stacked. Further, the first electrode 15 is provided over the part 17 of the first compound semiconductor layer 11 exposed by removing (etching) parts of the second compound semiconductor layer 13 and the active layer 12. When a current is passed from the second electrode 14 through the part of the active layer 12 directly beneath the second compound semiconductor layer 13 which is left to the first compound semiconductor layer 11 and the first electrode 15, the quantum well structure of the active layer 12 is excited by the injection of the current in the active layer 12, resulting in a light emitting state over the whole surface area. Incidentally, in FIG. 1A, only a part of the components of the light emitting diode is shown.

At least the exposed part of the first compound semiconductor layer 11, the exposed part of the active layer 12, the exposed part of the second compound semiconductor layer 13, and a part of the second electrode 14 are covered with an SOG layer 16. More specifically, in Example 1, the SOG layer 16 is covering the exposed part of the first compound semiconductor layer 11 (that part of the first compound semiconductor layer 11 which is not covered with the first electrode 15), the exposed part of the active layer 12, a part of the second electrode 14, a part of the first electrode 15, and the exposed part of the second compound semiconductor layer 13 (that part of the second compound semiconductor layer 13 which is not covered with the second electrode 14).

In Example 1, the second electrode 14 includes ITO. The light emitting diode in Example 1 is of the electrode transmitted light pickup type, in which the light emitted from the active layer 12 is transmitted through the second compound semiconductor layer 13, the second electrode 14, and the SOG layer 16, to go out to the exterior.

Besides, in the light emitting diode in Example 1, a first contact part (first pad part) 19A extending to the upper side of the SOG layer 16 from a first opening 18A provided in the SOG layer 16 is formed over the first electrode 15, and a second contact part (second pad part) 19B extending to the upper side of the SOG layer 16 from a second opening 18B provided in the SOG layer 16 is formed over the second electrode 14.

Now, a method of manufacturing the light emitting device according to Example 1 will be described below, referring to FIGS. 2A to 2D, which are schematic partially sectional views of the substrate and the like.

[Step 100]

First, a substrate 10A including sapphire is fed into an MOCVD apparatus, in which substrate cleaning in a carrier gas including hydrogen is conducted at a substrate temperature of 1050° C. for 10 min, and the substrate temperature is lowered to 500° C. Then, based on the MOCVD method, while supplying ammonia gas as a nitrogen material, trimethylgallium (TMG) gas as a gallium material is supplied, whereby an under layer 10B including GaN is crystal grown on the surface of the substrate 10A, and the supply of the TMG gas is stopped.

[Step 110]

Next, a first compound semiconductor layer 11 of a first conduction type, an active layer 12, and a second compound semiconductor layer 13 of a second conduction type different from the first conduction type are sequentially formed over the substrate 10.

Specifically, based on the MOCVD method, the substrate temperature is raised to 1020° C., and then supply of monosilane ($SiH_4$) gas as a silicon material is started at normal pressure, whereby the first compound semiconductor layer 11 including Si-doped GaN (GaN:Si) and having n-type conduction type and a thickness of 3 μm is crystal grown over the under layer 10B. Incidentally, the doping concentration is, for example, about $5\times10^{18}/cm^3$.

Thereafter, the supply of the TMG gas and the $SiH_4$ gas is once stopped, and the substrate temperature is lowered to 750° C. Then, triethylgallium (TEG) gas and trimethylindium (TMI) gas are supplied, and supply of these gases is conducted through valve changeover operations, whereby the active layer 12 including InGaN and GaN and having a multiple quantum well structure is crystal grown.

For example, in the case of a light emitting diode with a luminous wavelength of 400 nm, a multiple quantum well structure (e.g., having two well layers) including about 9%-In InGaN and GaN (in thicknesses of 2.5 nm and 7.5 nm) may be formed. Besides, in the case of a blue light emitting diode with a luminous wavelength of 460±10 nm, a multiple quantum well structure (e.g., having 15 well layers) including 15%-In InGaN and GaN (in thicknesses of 2.5 nm and 7.5 nm) may be formed. Further, in the case of a green light emitting diode with a luminous wavelength of 520±10 nm, a multiple quantum well structure (e.g., having nine well layers) including 23%-In InGaN and GaN (in thicknesses of 2.5 nm and 15 nm) may be formed.

After the formation of the active layer 12 is over, the supply of the TEG gas and the TMI gas is stopped, simultaneously attended by changeover of the carrier gas from nitrogen to hydrogen, the substrate temperature is raised to 850° C., and supply of the TMG gas and biscyclopentadienylmagnesium ($Cp_2Mg$) gas is started, whereby the second compound semiconductor layer 13 including Mg-doped GaN (GaN:Mg) and having a thickness of 100 nm is crystal grown on the active layer 12. Incidentally, the doping concentration is about $5\times10^{19}/cm^3$. Thereafter, the supply of the TMG gas and the $Cp_2Mg$ gas is stopped and, simultaneously, the substrate temperature is lowered to room temperature, to complete the crystal growth.

[Step 120]

After the crystal growth is thus completed, an annealing treatment in a nitrogen gas atmosphere at about 800° C. is conducted for 10 min, whereby the p-type impurity (p-type dopant) is activated.

[Step 130]

Thereafter, the second electrode 14 including ITO is formed on the second compound semiconductor layer 13, based on a sputtering method. Next, a part of the first compound semiconductor layer 11 is exposed (see FIG. 2A). Specifically, parts of the second electrode 14, the second compound semiconductor layer 13, and the active layer 12 are removed by a lithography technique and a dry etching technique, whereby a part 17 of the first compound semiconductor layer 11 is exposed. Thereafter, based on a lift-off method, the first electrode 15 is formed on the exposed part of the first compound semiconductor layer 11 (see FIG. 2B). Specifically, a resist layer is formed over the while surface area, an opening is formed in the resist layer on that part of the first compound semiconductor layer 11 at which to form the first electrode 15, then a metallic layer for constituting the first electrode 15 is formed over the whole surface area by a sputtering method, and then the resist layer is removed, whereby the first electrode 15 can be formed.

Next, at least the exposed part of the first compound semiconductor layer 11, the exposed part of the active layer 12, the exposed part of the second compound semiconductor layer 13, and a part of the second electrode 14 are covered with the SOG layer 16.

[Step 140]

Figure 2A:
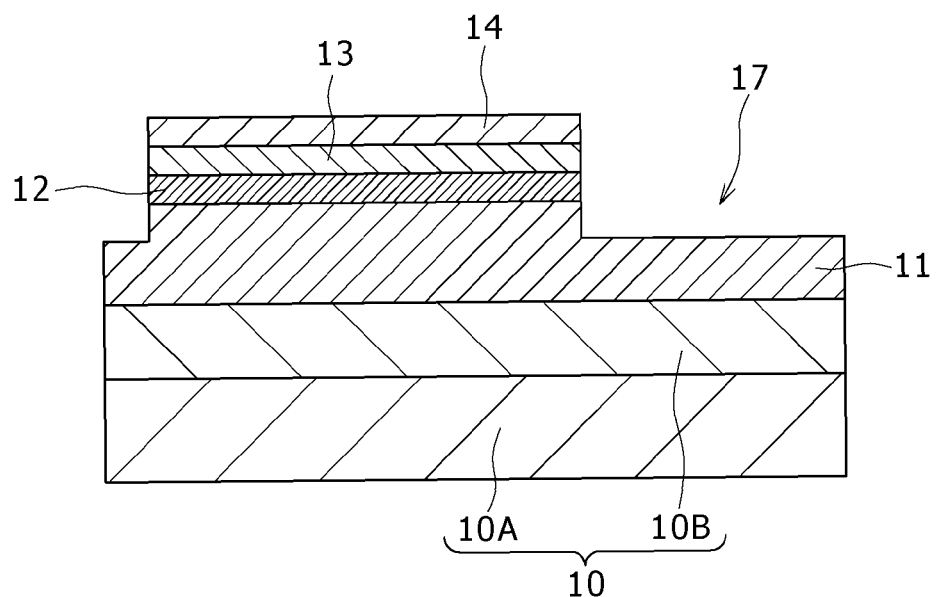
FIGS. 2A and 2B are schematic partly sectional views of a substrate and the like, for illustrating a method of manufacturing the light emitting device according to Example 1.
Figure 2B:
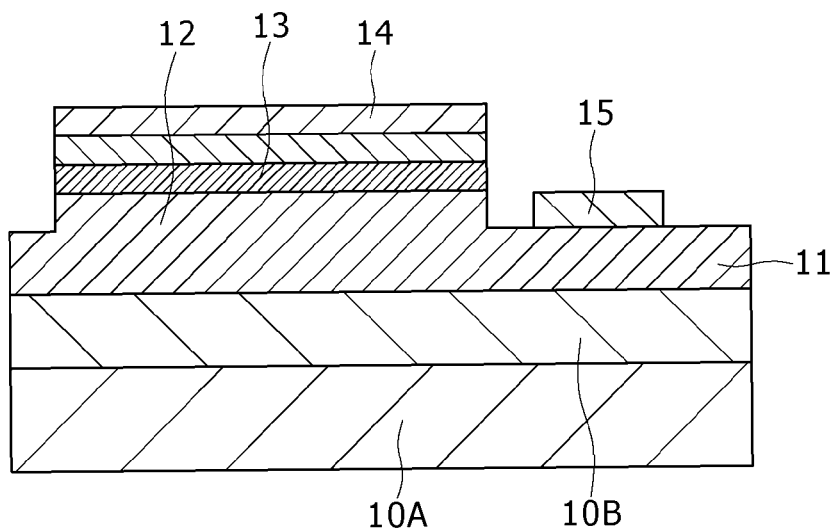
Figure 2C:
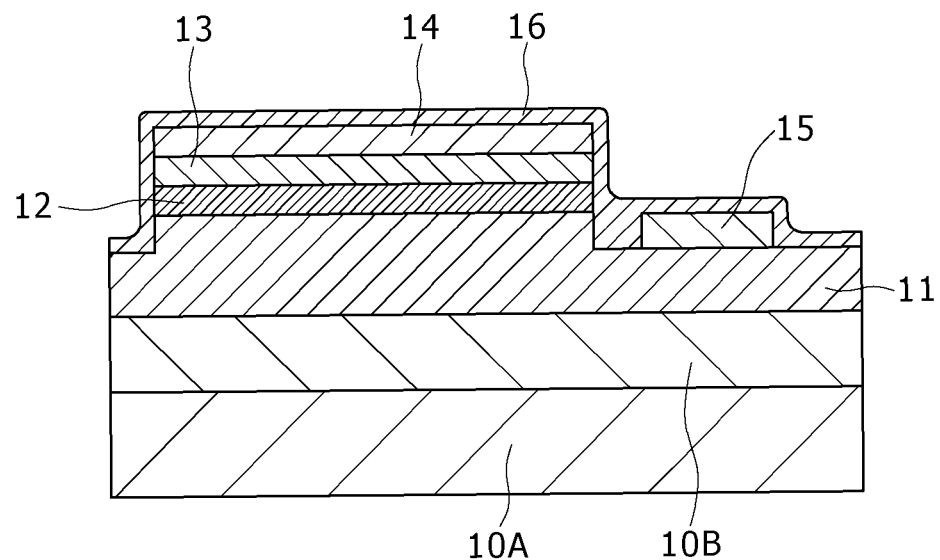
FIGS. 2C and 2D are schematic partly sectional views of the substrate and the like, for illustrating the method of manufacturing the light emitting device according to Example 1.

Specifically, first, the whole surface area, i.e., the exposed part of the first compound semiconductor layer 11, the exposed part of the active layer 12, the exposed part of the second compound semiconductor layer 13, the second electrode 14, and the first electrode 15 are covered with the SOG layer (see FIG. 2C). More specifically, first, an SOG material layer including a solution obtained by dissolving a silicic acid compound corresponding to a precursor of the SOG layer 16 in an organic solvent is formed over the whole surface area by, for example, a spin coating method. Next, the organic solvent is removed from the SOG material layer, followed by baking the SOG material layer, whereby the SOG layer 16 composed mainly of silicate glass ($SiO_2$) can be obtained. Examples of the baking conditions for the SOG material layer include an inert gas atmosphere such as a nitrogen gas atmosphere, 400° C., and 20 min. By the baking of the SOG material layer 16, the ITO constituting the second electrode 14 can simultaneously be annealed, whereby carriers can be generated in the second electrode 14.

[Step 150]

Figure 2D:
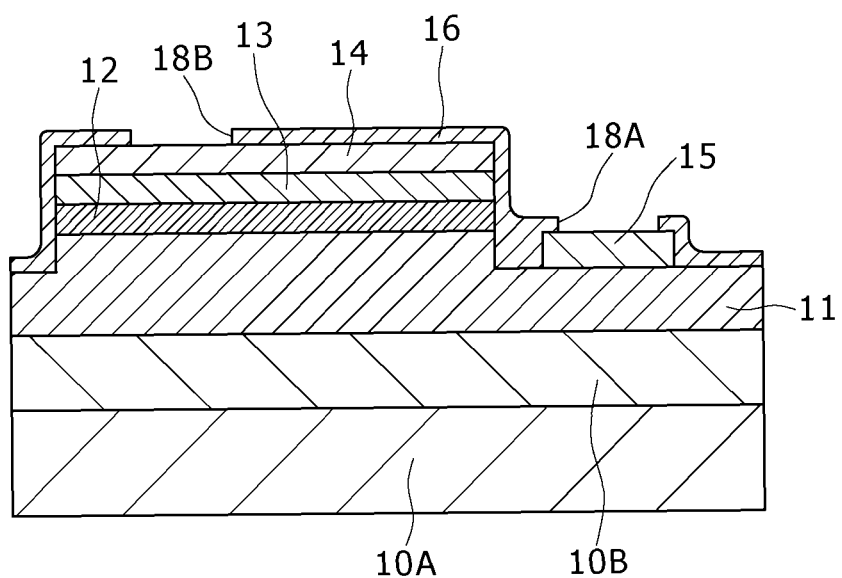

Thereafter, a first opening 18A and a second opening 18B are formed respectively in that part of the SOG layer 16 which is located on the first electrode 15 and that part of the SOG layer 16 which is located on the second electrode 14 by a lithography technique and a dry etching technique (see FIG. 2D).

[Step 160]

Next, the first contact part (first pad part) 19A extending to the upper side of the SOG layer 16 from the first electrode 15 through the first opening 18A is formed and, simultaneously, the second contact part (second pad part) 19B extending to the upper side of the SOG layer 16 from the second electrode 14 through the second opening 18B is formed. Incidentally, the first contact part (first pad part) 19A and the second contact part (second pad part) 19B each include, for example, a Ti layer/Pt layer formed by a vapor deposition method and an Au layer formed thereon by a plating method. Thereafter, dicing is conducted to obtain chips, whereby the light emitting diode shown in FIG. 1B can be obtained. Furthermore, resin molding and packaging may be conducted, whereby, for example, various light emitting diodes such as bullet-type ones and surface mounted type ones can be manufactured.

In Example 1, by forming the SOG layer 16, the second electrode 14 could be assuredly covered by a continuous film free of any grain boundary, and generation of pinholes or cracks was not observed. As a result, moisture could be securely prevented from reaching from the external atmosphere to the second electrode 14 including ITO, and generation of ion migration or formation of whiskers in the second electrode 14 with the result of deterioration of the second electrode 14 and deterioration of characteristics of the light emitting diode could be securely prevented. In addition, the refractive index of the SOG layer 16 having a thickness of 140 nm was measured over a wavelength range of 400 to 800 nm. As a result, it was found that the value of the real part (n) of the refractive index (=n+i·k) of the SOG layer 16 is 1.45, the value of the imaginary part (k) is 0, and absorption of light by the SOG layer 16 was found absent in the wavelength range of 400 to 800 nm.

EXAMPLE 2

Example 2 is a modification of Example 1. In Example 2, the second electrode 14 includes a layer of silver (Ag) formed by a vacuum evaporation method and having a thickness of about 100 nm. The light emitting diode in Example 2 is of the substrate-side light pickup type, in which the light emitted from the active layer 12 is transmitted directly through the substrate 10 to go out to the exterior, or is reflected by the second electrode 14 to be transmitted through the substrate 10 and to go out to the exterior. With the second electrode 14 including silver (Ag), a reflectance of not less than 96%, for example, can be attained.

Incidentally, the other steps and the configurations and structures of the light emitting diode in Example 2 can be made to be the same as in Example 1, and detailed description of them is therefore omitted.

EXAMPLE 3

Example 3 is a modification of Example 1 or Example 2. In Example 3, a step of exposing the surface of the SOG layer 16 to a plasma atmosphere is further provided between [Step 140] and [Step 150]. With the surface of the SOG layer 16 thus exposed to the plasma atmosphere, organic matters (e.g., hydrocarbons) contained in the surface portion of the SOG layer 16 are removed, whereby an SOG layer 16 with high quality can be obtained. Examples of the conditions of the plasma atmosphere include the conditions shown in the following Table 1. Incidentally, the treatment of exposing the surface of the SOG layer 16 to a plasma atmosphere can similarly be carried out also in the following Examples.

TABLE 1

| | |
|---|---|
| Plasma atmosphere: | $O_2$ gas, Ar gas, $N_2$ gas or the like, used either singly or in combination |
| Pressure: | 0.1 to 100 Pa |
| Applied power: | 350 W |
| Treating time: | 10 min |

EXAMPLE 4

Figure 3A:
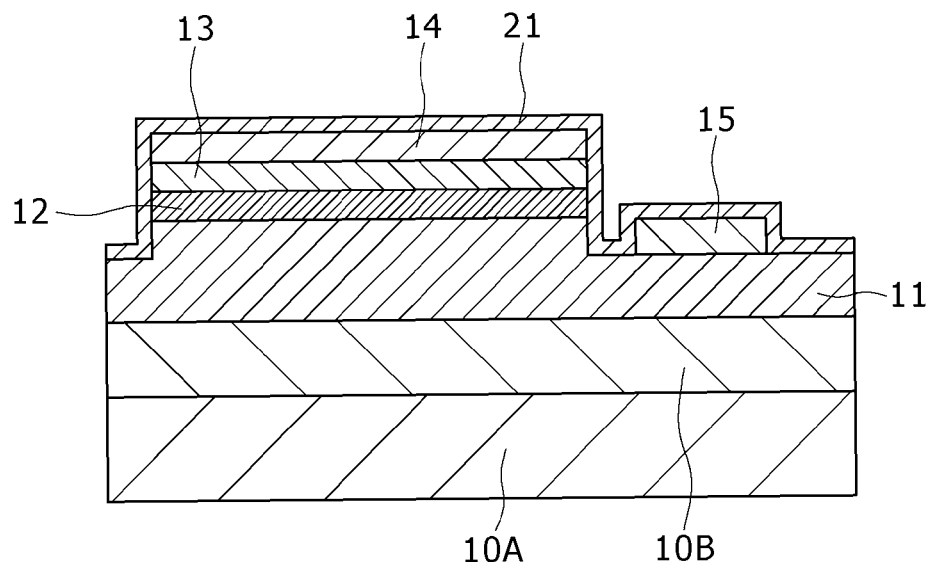
FIGS. 3A and 3B are schematic partly sectional views of a substrate and the like, for illustrating a method of manufacturing a light emitting device according to Example 4 of the present invention.
Figure 3B:
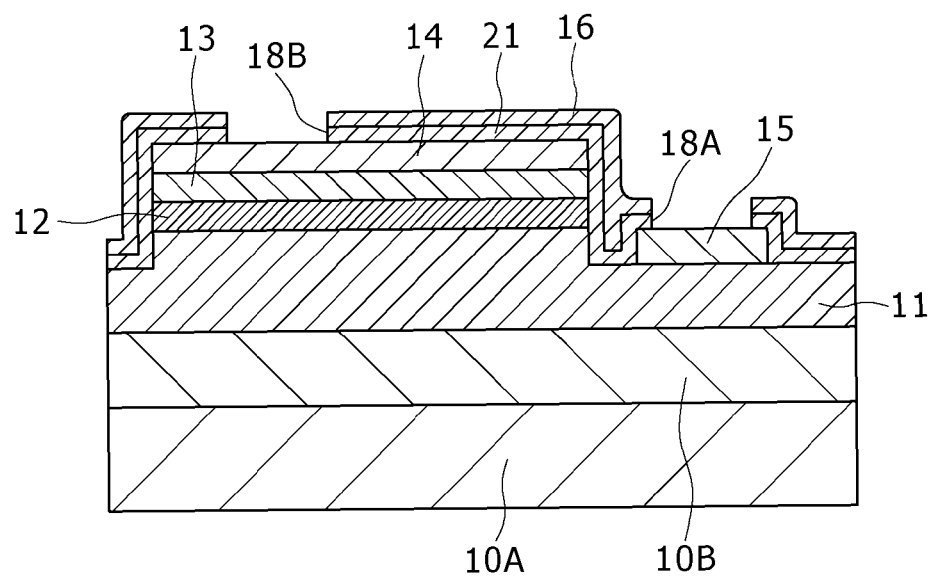

Example 4 is also a modification of Example 1 or Example 2. In a light emitting diode in Example 4, a first insulating layer 21 is formed under the SOG layer 16 (more specifically, at least between the exposed part of the first compound semiconductor layer 11 and the SOG layer 16, between the exposed part of the active layer 12 and the SOG layer 16, between the exposed part of the second compound semiconductor layer 13 and the SOG layer 16, and between the second electrode 14 and the SOG layer 16). In Example 4, a step of forming the first insulating layer 21 on the whole surface area is further provided (see FIG. 3A), i.e., a step of covering the exposed part of the first compound semiconductor layer 11, the exposed part of the active layer 12, the exposed part of the second compound semiconductor layer 13, the second electrode 14, and the first electrode 15 with the first insulating layer 21 is further provided, between [Step 130] and [Step 140] of Example 1. Besides, in a step similar to [Step 140] of Example 1, the first insulating layer 21 is covered with the SOG layer 16. Further, in a step similar to [Step 150] of Example 1, the first opening 18A and the second opening 18B are formed respectively in those parts of the SOG layer 16 and the first insulating layer 21 which are located over the first electrode 15 and those parts of the SOG layer 16 and the first insulating layer 21 which are located over the second electrode 14, by a lithography technique and a dry etching technique (see FIG. 14B). Here, the first insulating layer 21 includes a layer of $SiO_2$ having a thickness of about 100 nm, which is formed by a CVD method.

With the first insulating layer 21 thus formed under the SOG layer 16, it is possible to not only contrive enhanced reliability of the light emitting diode but also contrive flattening (planarization) of the under layer (substrate layer) for forming the SOG layer 16 thereon.

In the same manner as in Example 2, a light emitting diode with the second electrode 14 including Ag was manufactured. Incidentally, this light emitting diode is referred to as the light emitting diode of Example 4A. On the other hand, a light emitting diode in which the formation of the SOG layer 16 is omitted was manufactured as Comparative Example 4. The light emitting diode of Example 4A and the light emitting diode of Comparative Example 4 were subjected to a high-temperature high-humidity bias test (85° C., 85% RH), so as to compare the light emitting diodes in the time until generation of failure arising from ion migration. As a result, it was found that the time until generation of failure for the light emitting diode of Example 4A was longer than that for the light emitting diode of Comparative Example 4 by not less than 2000 hr. In addition, for the light emitting diode of Comparative Example 4, corrosion of the second electrode 14 arising from moisture coming through cracks or pinholes was observed, but not any corrosion of the second electrode 14 was observed for the light emitting diode of Example 4A. Furthermore, when the light emitting diode of Example 4A was subjected to aging at a very high temperature (150° C.), no problem was generated; this result indicates that no problem will arise from the difference between the coefficient of linear expansion of the material constituting the SOG layer 16 and the coefficient of linear expansion of the material constituting the first insulating layer 21.

EXAMPLE 5

Figure 4A:
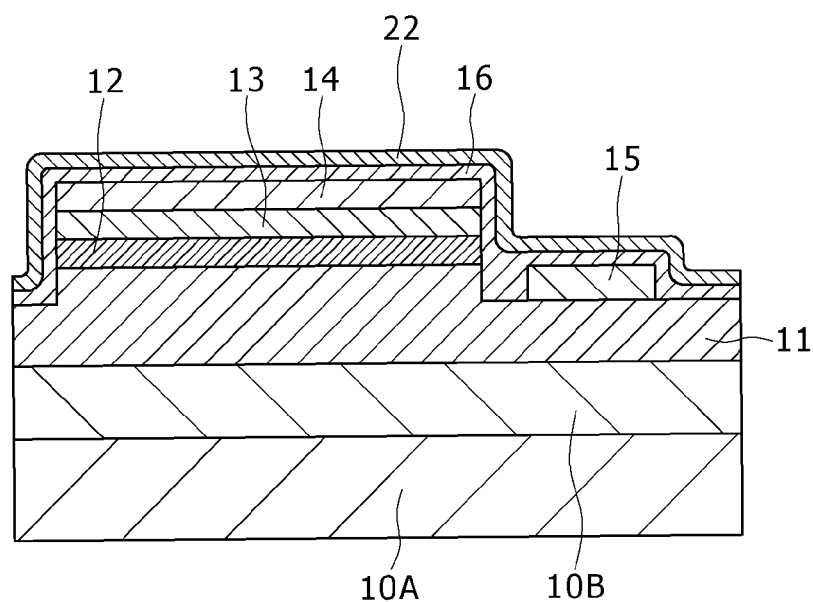
FIGS. 4A and 4B are schematic partly sectional views of a substrate and the like, for illustrating a method of manufacturing a light emitting device according to Example 5 of the present invention.
Figure 4B:
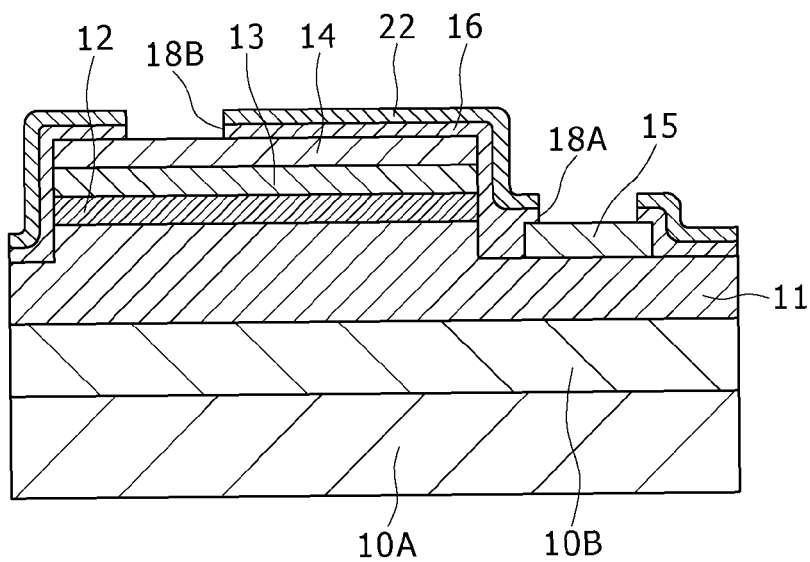

Example 5 is also a modification of Example 1 or Example 2. In a light emitting diode in Example 5, a second insulating layer 22 is formed on the SOG layer 16. In Example 5, in a step similar to [Step 140] of Example 1, the exposed part of the first compound semiconductor layer 11, the exposed part of the active layer 12, the exposed part of the second compound semiconductor layer 13, the second electrode 14, and the first electrode 15 are covered with the SOG layer 16. Subsequent to the step similar to [Step 140] of Example 1, a step of covering the SOG layer 16 with the second insulating layer 22, i.e., a step of forming the second insulating layer 22 on (over the whole surface area of) the SOG layer 16 is further provided (see FIG. 4A) between [Step 140] and [Step 150] of Example 1. Then, in a step similar to [Step 150] of Example 1, the first opening 18A and the second opening 18B are formed respectively in those parts of the second insulating layer 22 and the SOG layer 16 which are located over the first electrode 15 and those parts of the second insulating layer 22 and the SOG layer 16 which are located over the second electrode 14, based on a lithography technique and a dry etching technique (see FIG. 4B). Here, the second insulating layer 22 includes a layer of SiO₂ having a thickness of about 100 nm, which is formed by a CVD method.

With the second insulating layer 22 thus formed on the SOG layer 16, it is possible to not only contrive enhanced reliability of the light emitting diode but also contrive enhanced step coverage as to the second insulating layer 22 or the like, since the second insulating layer 22 is formed on the smooth SOG layer 16.

Incidentally, a method may also be adopted in which after the exposed part of the first compound semiconductor layer 11, the exposed part of the active layer 12, the exposed part of the second compound semiconductor layer 13, the second electrode 14, and the first electrode 15 are covered with the first insulating layer 21 between [Step 130] and [Step 140] of Example 1, the first insulating layer 21 is covered with the SOG layer 16 and the SOG layer 16 is further covered with the second insulating layer 22 in a step similar to [Step 140] of Example 1, and the first opening 18A and the second opening 18B are formed in the second insulating layer 22, the SOG layer 16 and the first insulating layer 21 in a step similar to [Step 150] of Example 1. In other words, a configuration may be adopted in which the first insulating layer 21 is formed under the SOG layer 16 (specifically, at least between the exposed part of the first compound semiconductor layer 11 and the SOG layer 16, between the exposed part of the active layer 12 and the SOG layer 16, between the exposed part of the second compound semiconductor layer 13 and the SOG layer 16, and between the second electrode 14 and the SOG layer 16), and the second insulating layer 22 is formed on the SOG layer 16. To be more specific, in Example 5, a step of forming the first insulating layer 21 over the whole surface area may be further provided between [Step 130] and [Step 140] of Example 1. Incidentally, in this case, in a step similar to [Step 150] of Example 1, the first opening 18A and the second opening 18B are formed in the second insulating layer 22, the SOG layer 16, and the first insulating layer 21.

EXAMPLE 6

Figure 6A:
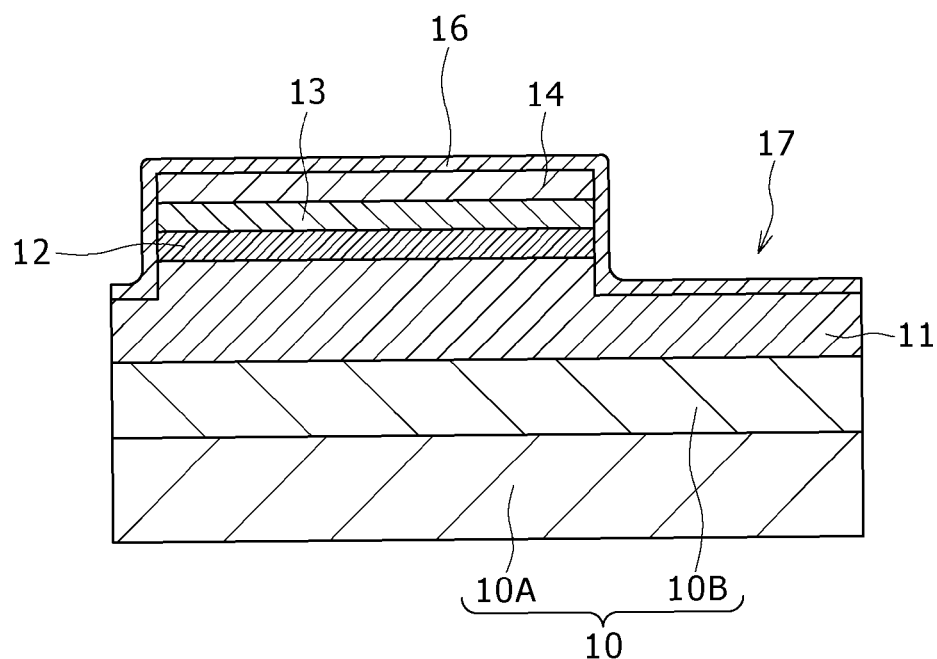
FIGS. 6A and 6B are schematic partly sectional views of a substrate and the like, for illustrating a method of manufacturing the light emitting device according to Example 6.
Figure 6B:
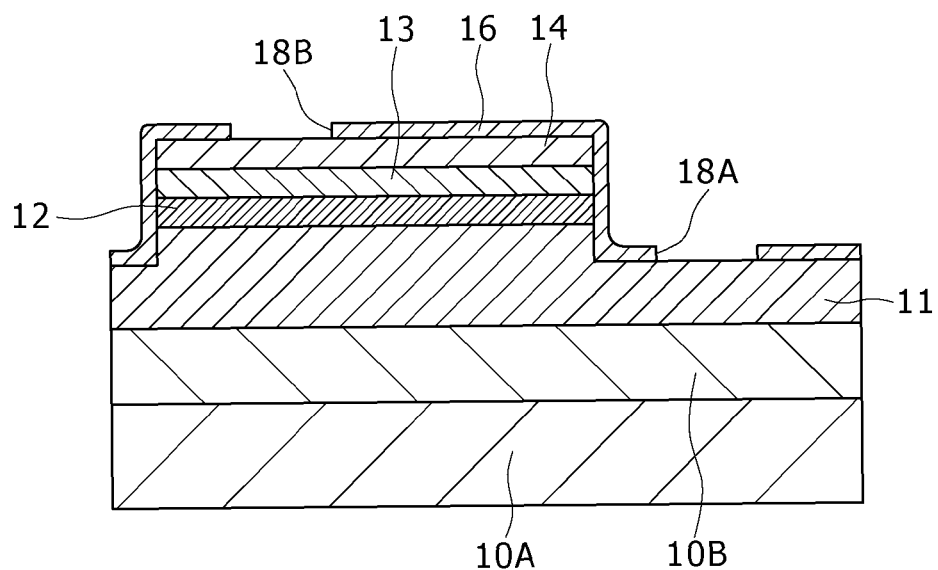

Example 6 relates to a method of manufacturing a light emitting diode according to a second embodiment of the present invention. The basic configuration and structure of the light emitting diode in Example 6 may be the same as the basic configuration and structure of the light emitting diode in Example 1 except for the configuration and structure of the part surrounding the first electrode, such as the first electrode extending to the upper side of the SOG layer; therefore, detailed description of them is omitted. Now, the method of manufacturing a light emitting device in Example 6 will be described below, referring to FIGS. 6A and 6B.

[Step 600]

First, steps similar to [Step 100] and [Step 110] of Example 1 are carried out, whereby a first compound semiconductor layer 11 of a first conduction type (n type, in Example 6), an active layer 12, and a second compound semiconductor layer 13 of a second conduction type (p type, in Example 6) different from the first conduction type are sequentially formed over a substrate 10, and then a step similar to [Step 120] of Example 1 is carried out.

[Step 610]

Next, a step similar to [Step 130] is carried out, whereby a second electrode 14 is formed on the second compound semiconductor layer 13, and then a part of the first compound semiconductor layer 11 is exposed. Incidentally, a first electrode is not formed in this step.

Thereafter, the exposed part of the first compound semiconductor layer 11 exclusive of that part at which to form a first electrode 15, the exposed part of the active layer 12, the exposed part of the second compound semiconductor layer 13, and a part of the second electrode 14 are covered with an SOG layer 16.

[Step 620]

Specifically, next, the exposed part of the first compound semiconductor layer 11, the exposed part of the active layer 12, the exposed part of the second compound semiconductor layer 13, and the second electrode 14 are covered with the SOG layer 16. Specifically, by carrying out a step similar to [Step 140] of Example 1, the SOG layer 16 is formed over the whole surface area (see FIG. 6A).

[Step 630]

Next, a first opening 18A is formed in the part of the SOG layer 16 covering that part of the first compound semiconductor layer 11 at which to form the first electrode 15, and a second opening 18B is formed in that part of the SOG layer 16 which is covering the second electrode 14. Specifically, the first opening 18A and the second opening 18B are formed respectively in that part of the SOG layer 16 which is located on the exposed part of the first compound semiconductor layer 11 and that part of the SOG layer 16 which is located on the second electrode 14, based on a lithography technique and a dry etching technique (see FIG. 6B).

[Step 640]

Thereafter, the first electrode 15 is formed on that exposed part of the first compound semiconductor layer 11 on which to form the first electrode 15. Specifically, the first electrode 15 is formed on the exposed part of the first compound semiconductor layer 11 which is exposed at a bottom part of the first opening 18A. More specifically, a step similar to [Step 130] of Example 1 is carried out, whereby the first electrode 15 is formed to extend over the SOG layer 16 in the vicinity the first opening 18A from that part of the first compound semiconductor layer 11 which is exposed at the bottom part of the first opening 18A.

[Step 650]

Figure 5:
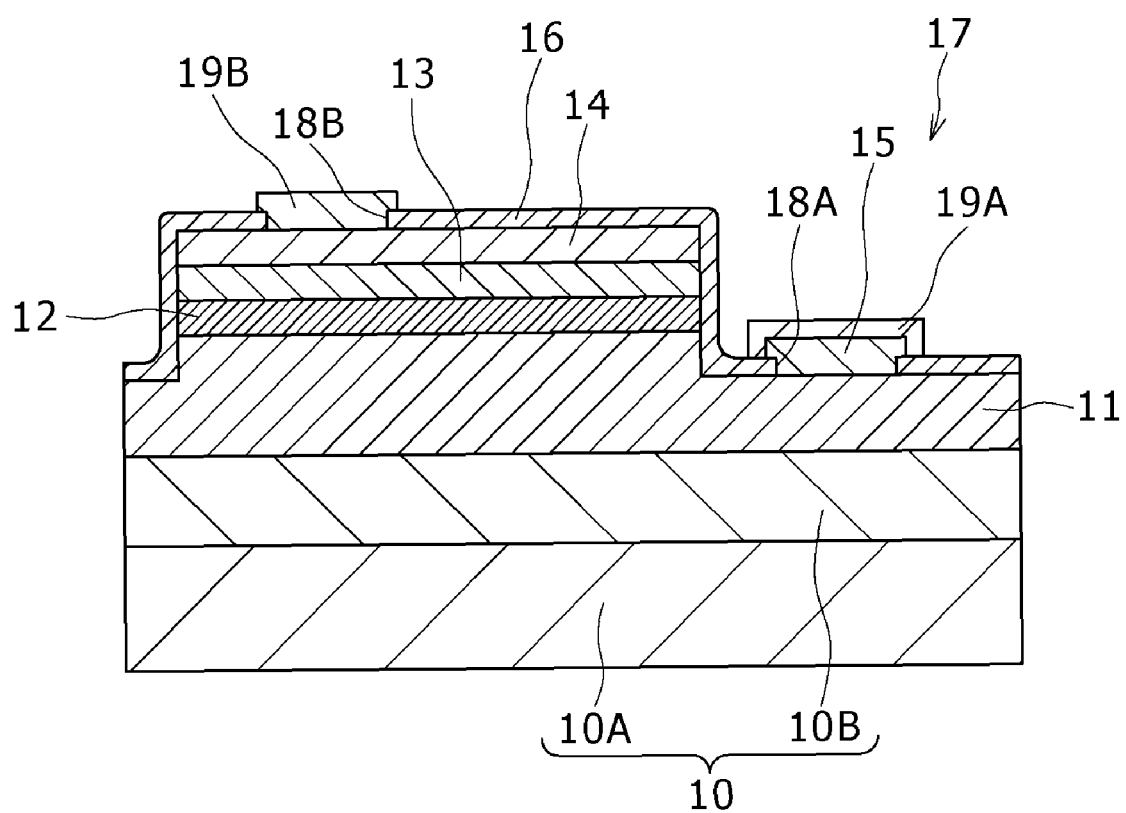
FIG. 5 is a schematic sectional view of a light emitting device according to Example 6 of the present invention, similar to the view taken along line B-B of FIG. 1A.

Next, a step similar to [Step 160] of Example 1 is carried out, whereby a first contact part (first pad part) 19A extending to the upper side of the SOG layer 16 from the first electrode 15 through the first opening 18A is formed and, simultaneously, a second contact part (second pad part) 19B extending to the upper side of the SOG layer 16 from the second electrode 14 through the second opening 18B is formed. Thereafter, dicing is conducted to obtain chips, whereby the light emitting diode shown in FIG. 5 can be obtained. Furthermore, resin molding or packaging is conducted, whereby various light emitting diodes such as bullet-type ones and surface mounted type ones can be manufactured.

Incidentally, in Example 6, also, the second electrode 14 may be configured by use of silver (Ag) in place of ITO, like in Example 2.

In addition, like in Example 4, a method may be adopted in which after the exposed part of the first compound semiconductor layer 11, the exposed part of the active layer 12, the exposed part of the second compound semiconductor layer 13, and the second electrode 14 are covered with the first insulating layer 21 between [Step 610] and [Step 620], the first insulating layer 21 is covered with the SOG layer 16 in a step similar to [Step 620], and the first opening 18A is formed in those parts of the SOG layer 16 and the first insulating layer 21 which cover that part of the first compound semiconductor layer 11 on which to form the first electrode 15, and the second opening 18B is formed in those parts of the SOG layer 16 and the first insulating layer 21 which cover the second electrode 14, in a step similar to [Step 630]. More specifically, a method may be adopted in which a step of forming the first insulating layer over the whole surface area is further provided between [Step 610] and [Step 620], and the first opening 18A and the second opening 18B are formed respectively in those parts of the SOG layer 16 and the first insulating layer which are located over the first electrode 15 and those parts of the SOG layer 16 and the first insulating layer which are located over the second electrode layer 14 by a lithography technique and a dry etching technique in

[Step 630].

Or, a method may be adopted in which like in Example 5, the exposed part of the first compound semiconductor layer 11, the exposed part of the active layer 12, the exposed part of the second compound semiconductor layer 13, and the second electrode 14 are covered with the SOG layer 16 and then the SOG layer 16 is covered with the second insulating layer 22 in a step similar to [Step 620], and the first opening 18A is formed in those parts of the second insulating layer 22 and the SOG layer 16 which cover that part of the first compound semiconductor layer 11 on which to form the first electrode 15, and the second opening 18B is formed in those parts of the second insulating layer 22 and the SOG layer 16 which cover the second electrode 14, in a step similar to [Step 630]. More specifically, a method may be adopted in which a step of forming the second insulating layer on (over the whole surface area of) the SOG layer 16 is further provided between [Step 620] and [Step 630], and the first opening 18A and the second opening 18B are formed respectively in those parts of the second insulating layer and the SOG layer 16 which are located over the first electrode 15 and those parts of the second insulating layer and the SOG layer 16 which are located over the second electrode layer 14 by a lithography technique and a dry etching technique in a step similar to [Step 630].

Or, a method may be adopted in which the exposed part of the first compound semiconductor layer 11, the exposed part of the active layer 12, the exposed part of the second compound semiconductor layer 13, and the second electrode 14 are covered with the first insulating layer 21 between [Step 610] and [Step 620], thereafter the first insulating layer 21 is covered with the SOG layer 16 and then the SOG layer 16 is covered further with the second insulating layer 22 in a step similar to [Step 620], and the first opening 18A is formed in those parts of the second insulating layer 22, the SOG layer 16 and the first insulating layer 21 which cover that part of the first compound semiconductor layer 11 at which to form the first electrode 15, and the second opening 18B is formed in those parts of the second insulating layer 22, the SOG layer 16 and the first insulating layer 21 which cover the second electrode 14, in a step similar to [Step 630]. More specifically, a method may be adopted wherein the first insulating layer is formed over the whole surface area between [Step 610] and [Step 620], and a step of forming the second insulating layer on (over the whole surface area of) the SOG layer 16 is further provided between [Step 620] and [Step 630]. Incidentally, in this case, the first opening 18A and the second opening 18B are formed in the second insulating layer, the SOG layer 16, and the first insulating layer in a step similar to [Step 630].

Figure 7:
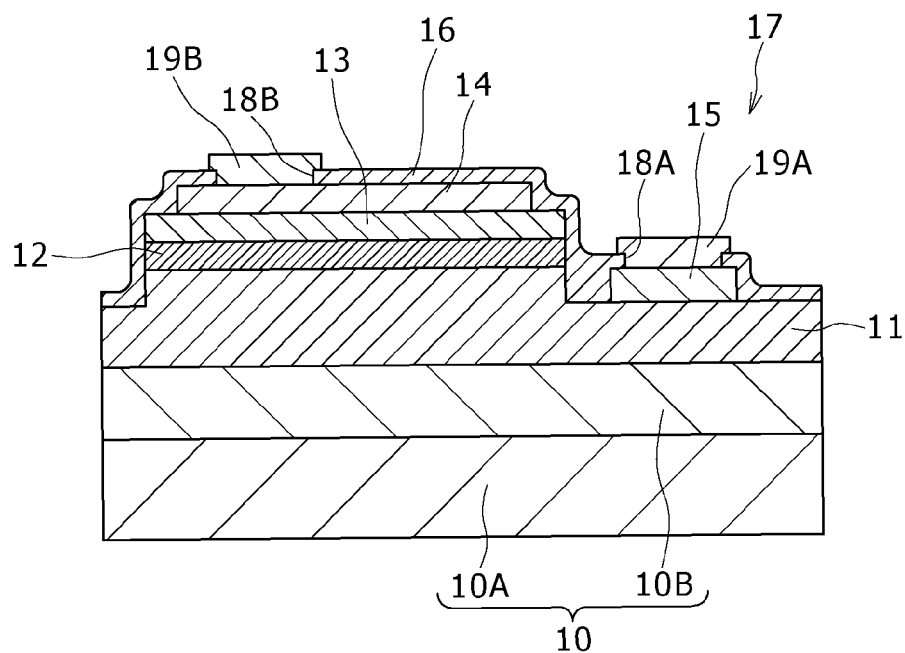
FIG. 7 is a schematic sectional view of a modified embodiment of the light emitting device according to Example 1, similar to the view taken along line B-B of FIG. 1A.
Figure 8:
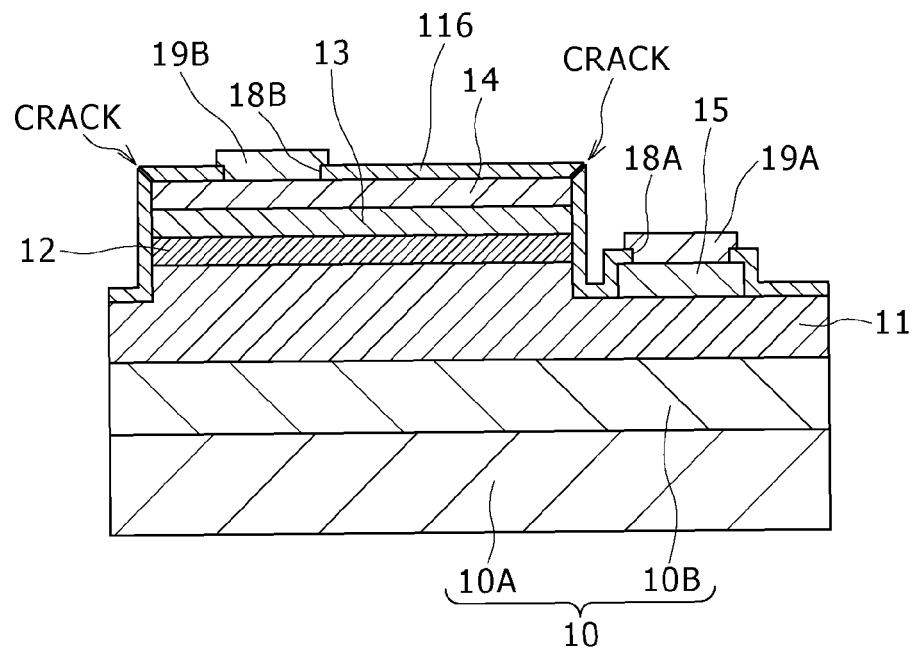
FIG. 8 is a schematic sectional view of a light emitting device according to a related art, for illustrating the problem involved in the light emitting device according to the related art.

While preferred Examples of the present invention have been described above, the invention is not construed as limited to these Examples. The configurations and structures of the light emitting device, the materials constituting the light emitting device, the manufacturing conditions for the light emitting device, and various numerical values as described in the Examples above are mere exemplifications, and they can be varied as required. For example, in the light emitting devices described in Examples 1 to 6, a structure may be adopted wherein a part of the second compound semiconductor layer 13 is covered with the second electrode 14, as a schematic partly sectional view is shown in FIG. 7, for example.

While a preferred embodiment of the present invention has been described using specific terms, such description is for illustrative purpose only, and it is to be understood that changes and variations may be made without departing from the spirit or scope of the following claims.

What is claimed is:

1. A method of manufacturing a light emitting device, comprising the steps of:
   (A) sequentially forming a first compound semiconductor layer of a first conduction type, an active layer, and a second compound semiconductor layer of a second conduction type different from said first conduction type, over a substrate; and
   (B) exposing a part of said first compound semiconductor layer, forming a first electrode over said exposed part of said first compound semiconductor layer and forming a second electrode over said second compound semiconductor layer,
   wherein said method further includes, subsequent to said step (B), the step of:
   (C) covering at least said exposed part of said first compound semiconductor layer, an exposed part of said active layer, an exposed part of said second compound semiconductor layer, and a part of said second electrode with an SOG layer; and
   (D) forming a first insulating layer over said substrate, the first insulating layer having a first surface in contact with the insulating layer, the first surface and the SOG layer overlap at least on a top surface of part of said second electrode.

2. The method of manufacturing the light emitting device as set forth in claim 1, wherein in said step (C), said exposed part of said first compound semiconductor layer, said exposed part of said active layer, said exposed part of said second compound semiconductor layer, said second electrode, and said first electrode are covered with said SOG layer, and thereafter a first opening and a second opening are formed respectively in that part of said SOG layer which is located over said first electrode and in that part of said SOG layer which is located over said second electrode.

3. The method of manufacturing the light emitting device as set forth in claim 2, wherein in said step (C), said exposed part of said first compound semiconductor layer, said exposed part of said active layer, said exposed part of said second compound semiconductor layer, said second electrode, and said first electrode are covered with the first insulating layer, thereafter said first insulating layer is covered with an SOG layer, and a first opening and a second opening are formed in said SOG layer and said first insulating layer.

4. The method of manufacturing the light emitting device as set forth in claim 2, wherein in said step (C), said exposed part of said first compound semiconductor layer, said exposed part of said active layer, said exposed part of said second compound semiconductor layer, said second electrode, and said first electrode are covered with an SOG layer, thereafter said SOG layer is covered with a second insulating layer, and a first opening and a second opening are formed in said second insulating layer and said SOG layer.

5. The method of manufacturing the light emitting device as set forth in claim 2, wherein in said step (C), said exposed part of said first compound semiconductor layer, said exposed part of said active layer, said exposed part of said second compound semiconductor layer, said second electrode, and said first electrode are covered with a first insulating layer, thereafter said first insulating layer is covered with an SOG layer, said SOG layer is further covered with a second insulating layer, and then a first opening and a second opening are formed in said second insulating layer, said SOG layer and said first insulating layer.

6. A method of manufacturing a light emitting device, comprising the steps of:
 (A) sequentially forming a first compound semiconductor layer of a first conduction type, an active layer, and a second compound semiconductor layer of a second conduction type different from said first conduction type, over a substrate; and
 (B) exposing a part of said first compound semiconductor layer and forming a second electrode over said second compound semiconductor layer,
 wherein said method further includes, subsequent to said step (B), the steps of:
  (C) covering said exposed part of said first compound semiconductor layer exclusive of an area in which a first electrode is to be formed, an exposed part of said active layer, an exposed part of said second compound semiconductor layer, and a part of said second electrode with an SOG layer; and
  (D) forming, subsequent to step (C),said first electrode over said area, of said exposed part of said first compound semiconductor layer.

7. The method of manufacturing the light emitting device as set forth in claim 6, wherein
 said exposed part of said first compound semiconductor layer, said exposed part of said active layer, said exposed part of said second compound semiconductor layer, and said second electrode are covered with said SOG layer, then a first opening is formed in a part of said SOG layer covering said area of said exposed part of said first compound semiconductor layer, and a second opening is formed in that part of said SOG layer which covers said second electrode, in said step (C); and
 said first electrode is formed on that part of said first compound semiconductor layer which is exposed at a bottom part of said first opening, in said step (D).

8. The method of manufacturing the light emitting device as set forth in claim 7, wherein in said step (C), said exposed part of said first compound semiconductor layer, said exposed part of said active layer, said exposed part of said second compound semiconductor layer, and said second electrode are covered with a first insulating layer, thereafter said first insulating layer is covered with said SOG layer, then said first opening is formed in those parts of said SOG layer and said first insulating layer which cover said area, of said exposed part of said first compound semiconductor layer, and said second opening is formed in those parts of said SOG layer and said first insulating layer which cover said second electrode.

9. The method of manufacturing the light emitting device as set forth in claim 7, wherein in said step (C), said exposed part of said first compound semiconductor layer, said exposed part of said active layer, said exposed part of said second compound semiconductor layer, and said second electrode are covered with said SOG layer, thereafter said SOG layer is covered with a second insulating layer, then said first opening is formed in those parts of said second insulating layer and said SOG layer which cover said part, at which to form said first electrode, of said exposed part of said first compound semiconductor layer, and said second opening is formed in those parts of said second insulating layer and said SOG layer which cover said second electrode.

10. The method of manufacturing the light emitting device as set forth in claim 7, wherein in said step (C), said exposed part of said first compound semiconductor layer, said exposed part of said active layer, said exposed part of said second compound semiconductor layer, and said second electrode are covered with a first insulating layer, thereafter said first insulating layer is covered with said SOG layer, said SOG layer is further covered with a second insulating layer, then said first opening is formed in those parts of said second insulating layer, said SOG layer and said first insulating layer which cover said part, at which to form said first electrode, of said exposed part of said first compound semiconductor layer, and said second opening is formed in those parts of said second insulating layer, said SOG layer and said first insulating layer which cover said second electrode.

11. The method of manufacturing the light emitting device as set forth in claim 6, wherein
 said second electrode includes ITO; and
 in said step (C), an SOG material layer is formed as an SOG layer precursor, thereafter said SOG material layer is baked to obtain said SOG layer and, simultaneously, to anneal said ITO constituting said second electrode.

12. The method of manufacturing the light emitting device as set forth in claim 11, wherein the baking conditions for said SOG material layer in said step (C) are either an inert gas atmosphere, a baking temperature of 250 to 700° C., and a baking time of 5 to 60 min, or an inactive gas atmosphere containing 0.1 to 20 vol % of oxygen gas, a baking temperature of 250 to 700° C., and a baking time of 5 to 60 min.

13. The method of manufacturing the light emitting device as set forth in claim 6, wherein said second electrode contains silver.

14. The method of manufacturing the light emitting device as set forth in claim 6, further comprising the step of exposing a surface of said SOG layer to a plasma atmosphere after said SOG layer is formed in said step (C).

* * * * *

UNITED STATES PATENT AND TRADEMARK OFFICE
CERTIFICATE OF CORRECTION

| | | |
|---|---|---|
| PATENT NO. | : 7,858,418 B2 | Page 1 of 1 |
| APPLICATION NO. | : 11/873763 | |
| DATED | : December 28, 2010 | |
| INVENTOR(S) | : Yoshiaki Watanabe et al. | |

It is certified that error appears in the above-identified patent and that said Letters Patent is hereby corrected as shown below:

Col. 18 lines 37-41
In claim 1:

"(D) forming a first insulating layer over said substrate, the first insulating layer having a first surface in contact with the insulating layer, the first surface and the SOG layer overlap at least on a top surface of part of said second electrode"

should be:

--(D) forming a first insulating layer over said substrate, the first insulating layer having a first surface in contact with the SOG layer, the first surface and the SOG layer overlap at least on a top surface of part of said second electrode--

Signed and Sealed this
Fourteenth Day of February, 2012

David J. Kappos
*Director of the United States Patent and Trademark Office*